(12) United States Patent
Mougnier et al.

(10) Patent No.: US 9,349,962 B2
(45) Date of Patent: May 24, 2016

(54) COMPOSITION FOR AN ACTIVE LAYER OR ELECTRODE OF PHOTOVOLTAIC CELLS

(75) Inventors: Sébastien-Jun Mougnier, Talence (FR); Cyril Brochon, Merignac (FR); Georges Hadziioannou, Leognan (FR); Eric Cloutet, Saint-caprais de Bordeaux (FR); Christophe Navarro, Bayonne (FR)

(73) Assignees: ARKEMA FRANCE, Colombes (FR); UNIVERSITE DE BORDEAUX 1, Talence (FR); CENTRE NATIONAL DE LA RECHERCHE SCIENTIFIQUE, Paris (FR); INSTITUT POLYTECHNIQUE DE BOURDEAUX, Talence (FR)

( * ) Notice: Subject to any disclaimer, the term of this patent is extended or adjusted under 35 U.S.C. 154(b) by 134 days.

(21) Appl. No.: 14/115,509

(22) PCT Filed: Apr. 26, 2012

(86) PCT No.: PCT/FR2012/050922
§ 371 (c)(1),
(2), (4) Date: Dec. 4, 2013

(87) PCT Pub. No.: WO2012/150404
PCT Pub. Date: Nov. 8, 2012

(65) Prior Publication Data
US 2014/0083500 A1    Mar. 27, 2014

(30) Foreign Application Priority Data
May 2, 2011   (FR) ...................................... 11 53720

(51) Int. Cl.
*H01L 31/0224*   (2006.01)
*H01L 51/00*   (2006.01)
(Continued)

(52) U.S. Cl.
CPC ............. *H01L 51/0046* (2013.01); *B82Y 10/00* (2013.01); *B82Y 30/00* (2013.01);
(Continued)

(58) Field of Classification Search
CPC . H01L 51/0048; H01L 51/441; H01L 51/424; H01L 51/0046; H01L 51/0043; H01L 51/0047; H01L 51/0036
USPC ....................................................... 136/263
See application file for complete search history.

(56) References Cited

U.S. PATENT DOCUMENTS 6,096,825 A        8/2000  Garnier
2006/0118768 A1*   6/2006  Liu et al. ................ 252/500
(Continued)

FOREIGN PATENT DOCUMENTS

WO    WO 95/29199 A1    11/1995
WO    WO 2006/096550 A2   9/2006

OTHER PUBLICATIONS

Striolo et al., Adsorption of Comb Copolymers on Weakly Attractive Solid Surfaces, Journal of Chemical Physics, vol./Issue 123, pp. 064710-1-064710-15, (2005).*
(Continued)

*Primary Examiner* — Jayne Mershon
(74) *Attorney, Agent, or Firm* — Buchanan Ingersoll & Rooney P.C.

(57) ABSTRACT

A composition including a graft copolymer, having: a linear trunk including at least one non-aromatic vinyl polymer or an unsaturated polyolefin; and at least two grafts attached to said trunk via a chemical bond, each graft having a conjugated polymer, characterized in that said composition further includes: fullerenes and a conjugated polymer; or carbon and/or graphene nanotubes. Also, a photovoltaic module incorporating such a composition, and to the use of said composition for the same purposes. Finally, methods for synthesizing the molecules forming all or part of the composition.

17 Claims, 1 Drawing Sheet

Figure 1:
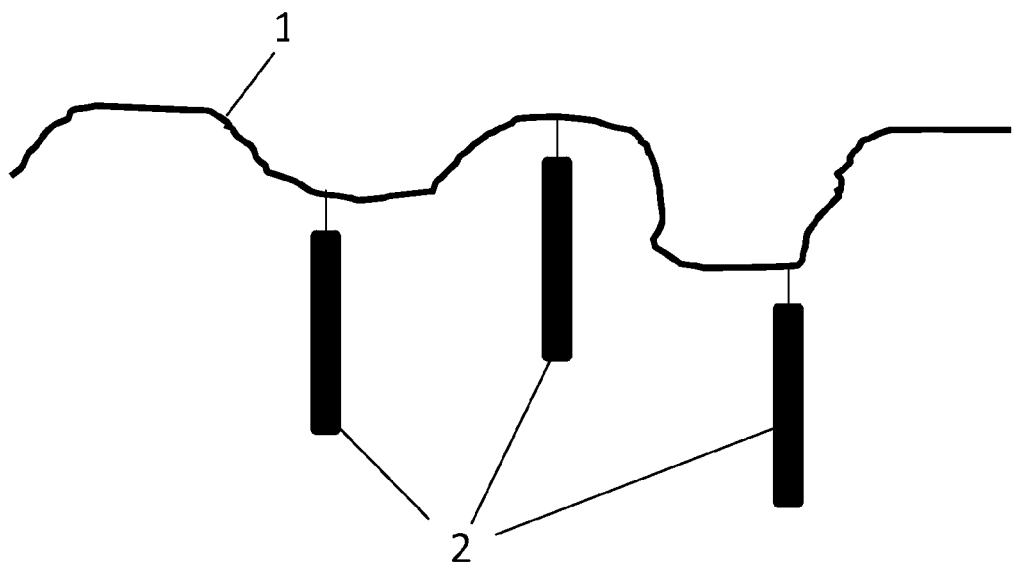

(51) Int. Cl.
  *B82Y 10/00* (2011.01)
  *B82Y 30/00* (2011.01)
  *C08F 290/06* (2006.01)
  *C08G 61/12* (2006.01)
  *C08G 81/02* (2006.01)
  *C08K 3/04* (2006.01)
  *H01L 51/44* (2006.01)
  *H01L 51/42* (2006.01)

(52) U.S. Cl.
  CPC .......... *C08F 290/06* (2013.01); *C08G 61/126* (2013.01); *C08G 81/024* (2013.01); *C08K 3/04* (2013.01); *H01L 51/0036* (2013.01); *H01L 51/0043* (2013.01); *H01L 51/0047* (2013.01); *H01L 51/0048* (2013.01); *H01L 51/424* (2013.01); *H01L 51/441* (2013.01); *C08G 2261/128* (2013.01); *C08G 2261/3223* (2013.01); *C08G 2261/91* (2013.01); *H01L 51/4253* (2013.01); *Y02E 10/549* (2013.01)

(56) References Cited

U.S. PATENT DOCUMENTS

| | | |
|---|---|---|
| 2008/0017244 A9 | 1/2008 | Sun |
| 2009/0229667 A1 | 9/2009 | Shrotriya et al. |
| 2011/0105712 A1* | 5/2011 | Jiang et al. ......... G01N 33/6845 528/26 |

OTHER PUBLICATIONS

Lee et al., Synthesis and photophysical property of well-defined donor-acceptor diblock copolymer based on regioregular poly(e-heylthiophene) and fullerene, Journal of Materials Science, pp. 1483-1489 (2009).*

Richard et al., Design of a Linear Poly(3-hexylthiophene)/Fullerene-Based Donor-Acceptor Rod-Coil Block Copolymer, Macromolecular Rapid Communications, pp. 885-891 (2008).*

International Search Report (PCT/ISA/210) mailed on Jul. 23, 2012, by the French Patent Office as the International Searching Authority for International Application No. PCT/FR2012/050922.

Sahmetlioglu et al., "Synthesis and characterization of conducting copolymers of poly (vinyl alcohol) with thiophene side-groups and pyrrole", Polymer International, Jan. 2004, pp. 2138-2144, vol. 53, No. 12.

Baker et al., "Synthesis of polyacetylene block/graft copolymers", Macromolecules, Dec. 1984, pp. 2619-2626, vol. 17, No. 12.

Tanaka et al., "Alternate network film of thiol group-terminated polythiophene and gold nanoparticle", Science Direct, Polymer, Sep. 2007, pp. 5884-5888, vol. 48, No. 20.

Palaniappan et al., "Poly(3-hexylthiophene)-CdSe Quantum Dot Bulk Heterojunction Solar Cells: Influence of the Functional End-Group of the Polymer", Macromolecules, Jun. 2009, pp. 3845-3848, vol. 42, No. 12.

Mougnier et al., "Design of Well-Defined Monofunctionalized Poly(3-hexylthiophene)s: Toward the Synthesis of Semiconducting Graft Copolymers", Macromolecular Rapid Communications, Apr. 2012, pp. 703-709, vol. 33, No. 8.

* cited by examiner

COMPOSITION FOR AN ACTIVE LAYER OR ELECTRODE OF PHOTOVOLTAIC CELLS

FIELD OF THE INVENTION

A subject matter of the invention is a composition for organic photovoltaic cells of photovoltaic modules exhibiting optimum properties for this application and also the same composition, very slightly different (one component less), for electrodes. The present invention also relates to the use of such a composition in organic photovoltaic cells of a photovoltaic module and to a photovoltaic module comprising such photovoltaic cells, and also to its use in electrodes.

In the following, the composition according to the invention is presented from the viewpoint of the technical problems related to the field of photovoltaic cells but it has become apparent to the applicant company that the particularly significant and numerous advantages of this composition render the latter capable of being envisaged as technical solution for issues existing in other fields, from the viewpoint in particular of its solution to at least one technical problem (dispersion of graphene or carbon nanotubes which can be used in the manufacture of electrodes).

Global warming, linked to the greenhouse gases given off by fossil fuels, has led to the development of alternative energy solutions which do not emit such gases during their operation, such as, for example, photovoltaic modules. A photovoltaic module comprises a "photovoltaic cell", this cell being capable of converting light energy into electricity.

Numerous types of photovoltaic panel structure exist.

Currently, use is predominantly made of "inorganic" photovoltaic panels, that is to say panels which operate with a board of semiconductors, generally of silicon, forming a photovoltaic cell for trapping the photons. By way of example, a photovoltaic cell conventionally comprises a plurality of individual cells, each individual cell comprising a photovoltaic sensor in contact with electron collectors placed above (upper collectors) and below (lower collectors) the photovoltaic sensor. When the photovoltaic cell is placed under a light source, it delivers a continuous electric current, which can be recovered at the terminals of the cell.

In addition to the inorganic photovoltaic cell, photovoltaic cells of organic type, that is to say that the photovoltaic cells are composed of polymers, are also known. Following the example of inorganic photovoltaic cells, these organic photovoltaic cells absorb the photons, bound electron-hole pairs (excitons) being generated and contributing to the photocurrent.

The organic photovoltaic cell is less expensive, can be recycled and can be extended to flexible products or various conformations (for example building tiles), giving access to markets inaccessible to conventional technologies, in particular by their incorporation in multifunctional systems. Nevertheless, this solution has suffered, to date, from a very low overall effectiveness level since the efficiency of such photovoltaic cells remains less than 5%. Furthermore, currently, the lifetime of the photovoltaic cells is very limited.

STATE OF THE ART

The mediocre performance and the mediocre lifetime of organic photovoltaic cells are directly related to a number of physicochemical parameters which currently present difficulties.

An organic photovoltaic cell is composed of an electron-donating material and an electron-accepting material. A first technical problem is posed from the viewpoint of the control of the morphology of mixing of the electron-donating and electron-accepting materials.

Currently, in order to overcome this difficulty, the strategy consists in varying the annealing conditions in order to obtain the desired morphology but it is also known, for example from the document US 2009/0229667, to add additives, such as alkyl halides or alkanedithiols, which will act as plasticizer capable of migrating but which do not stabilize the morphologies. Nevertheless, if it is desired to obtain stable structures, it is necessary to introduce surfactants. In particular, it is known that there exist diblock or triblock copolymers having a conjugated sequence or diblock copolymers not comprising any conjugated sequence. The document US 2008/0017244 is also known but the block copolymers here act as transporter of charges (donor/acceptor) and also as surfactant but do not solve the abovesaid first technical problem.

None of these existing solutions is very satisfactory regarding the control or stabilization of the morphology of mixing of the electron-donating and electron-accepting materials.

A second technical problem lies in the control and stabilization of the dispersion of the material, whether at the level of the active layer or of the electrode (semiconducting polymer, graphene, carbon nanotubes, and the like), in the liquid medium for the preparation of ink. This is because the preparation of the organic photovoltaic cells takes place essentially by the wet route, that is to say by using inks. As regards the electrodes, this is also applicable to other types of devices, such as organic light-emitting diodes (OLEDs).

The known solutions currently consist in adding additives, such as a surfactant (ionic or neutral), or hydrophilic polymers, such as poly(vinyl alcohol). These additives are not completely satisfactory as it is in particular known to a person skilled in the art that they have a tendency to bring about coagulation of the fillers present.

A final problem lies in the control and stabilization of the organic/inorganic interfaces in an organic photovoltaic cell conventionally disposing of at least one metal electrode.

The solutions currently used consist of the addition of an intermediate layer attached/adhesively bonded to said electrode, such as another semiconducting polymer or a self-assembled monolayer of small molecules (SAM). Again, these solutions, although making it possible to partially solve the problem, are not completely satisfactory.

BRIEF DESCRIPTION OF THE INVENTION

The present invention is intended to solve the problems of the organic photovoltaic cells of photovoltaic modules and of the electrodes of the prior art by providing a composition, for an active layer and/or electrode of an organic photovoltaic cell, comprising a combination of a grafted copolymer of a specific type and of one or more specific substances creating a synergy with said copolymer.

It has been found, by the applicant company, after various experiments and handling operations, that a specific structure could alone exhibit optimum results making it possible:
  to improve the compatibilization of a mixture between an electron-donating material and an electron-accepting material in a organic photovoltaic/solar cell, whether in terms of performance or in terms of stability;
  to improve the quality of the inks (their stabilities in particular over time), in particular of the dispersion of carbon nanotubes and of graphene which can be used for the manufacture of electrodes;
  to prevent the metal/organic material interface physicochemical problem.

Generally, these technical problems being solved, the organic photovoltaic cells or an electrode incorporating the composition according to the invention exhibit a much greater energy efficiency than those of the prior art.

Thus, the present invention relates to a composition comprising a grafted copolymer consisting:
- of a linear trunk comprising at least one nonaromatic vinyl polymer or one unsaturated polyolefin, and
- at least two grafts, attached to said trunk via a chemical bond, each consisting of a conjugated polymer, characterized in that said composition additionally comprises:
- fullerenes and a conjugated polymer, or
- carbon nanotubes and/or graphene.

Thus, the composition according to the invention exhibits an alternative.

In the case where this composition is intended to be used to form all or part of photovoltaic cells, the abovesaid copolymer will be combined with fullerenes and a conjugated polymer. The last two components are necessary in order to correspond to the characteristics specific to the photovoltaic field, including in particular the transparency of the composition and its thermal and mechanical resistivity.

Furthermore, it should be noted that the term "fullerenes" is understood to mean a molecule composed exclusively of carbons which can take any geometric shape recalling that of a sphere, of an ellipsoid, of a tube (known as nanotube) or of a ring.

In the case where this composition is intended to be used as electrode, the conjugated polymer is no longer necessary, carbon nanotubes and/or graphene being desired for their good electrical conductivities without requiring transparency properties.

In both alternatives, it has been demonstrated, after multiple experiments, that the abovesaid copolymer makes it possible to obtain, with said fullerenes and said conjugated polymer or with said carbon nanotubes and/or graphenes, highly advantageous results, in particular those mentioned above.

Other advantageous characteristics of the invention are specified subsequently:
- advantageously, the two grafts have the same molar mass;
- preferably, the abovesaid grafts consist of poly(3-hexylthiophene);
- advantageously, the linear trunk, of unsaturated polyolefin nature, consists of a polydiene, preferably a polyisoprene or a polybutadiene, preferentially a polyisoprene;
- according to an alternative solution, the linear trunk, of unsaturated polyolefin nature, consists of an acrylic polymer or polyacrylate;
- said trunk can advantageously consist of a polyalkyl acrylate, preferably poly(n-butyl acrylate);
- preferably, the trunk has hydroxyl functional groups so as to confer amphiphilic properties on it;
- according to one possibility, the linear trunk, of unsaturated polyolefin nature, consists of poly(vinyl alcohol).

The invention relates to the use of the composition described above in the organic photovoltaic cells of a photovoltaic module.

In addition, the invention also relates to a photovoltaic module exhibiting at least one layer forming an encapsulant comprising a photovoltaic cell, consisting of a plurality of organic photovoltaic cells capable of generating electrical energy, and a layer forming a back sheet, said photovoltaic cell comprising a composition as described above.

Finally, the present invention relates to methods for novel syntheses of the composition according to the invention or intermediate components/materials necessary for its manufacture.

Thus, the present invention relates to a process for the synthesis of the conjugated polymer, preferably ω-thiol-terminated poly(3-hexylthiophene), comprising the successive stages of:
- treatment of an amount A1 of ω-allyl-terminated P3HT in a container placed beforehand under an inert atmosphere, for example by a plurality of vacuum/molecular nitrogen cycles;
- addition of an amount A2 of nonpolar aromatic solvent, preferably toluene, the A1/A2 ratio being between 15 and 50;
- addition of an amount A3 of an alkanedithiol, preferably 1,3-propanedithiol, A3 being less than A2;
- addition of an amount A4 of a radical generator of the peroxide or diazo type, such as, preferably, azobisisobutyronitrile (AIBN), A4 being less than A2;
- maintenance of the mixture at a temperature between 0° C. and 200° C., depending on the radical-generating systems used, and typically from 40° C. and 130° C., for a minimum time of one hour in the preferred case of the use of AIBN;
- addition of an optional amount A5 of radical generator which can be similar or not to that used in A4, such as azobisisobutyronitrile (AIBN), A5 preferably being equal to A4 but being able to be between 0 and 10 A4;
- optional maintenance, in the case where A5 is nonzero, of the mixture at a temperature of between 0° C. and 200° C., depending on the radical-generating systems used, and typically from 40° C. and 130° C., for a minimum time of one hour in the preferred case of the use of AIBN.

The invention also relates to a process for the synthesis of grafted copolymer polyolefin-g-P3HT, preferably PI-g-P3HT, comprising the successive stages of:
- treatment of an amount A1 of ω-thiol-terminated P3HT in a container placed under an inert atmosphere, for example by a plurality of vacuum/molecular nitrogen cycles;
- addition of an amount A2 of nonpolar aromatic solvent, preferably toluene, the A1/A2 ratio being between 5 and 30;
- maintenance of the mixture at more than 25° C. and preferably at more than 40° C. for at least 30 minutes;
- addition of an amount A3 of unsaturated polyolefin, such as polybutadiene or preferably poly(isoprene), A3 being between A1 and A2;
- addition of an amount A4 of a radical generator of the peroxide or diazo type, such as, preferably, azobisisobutyronitrile (AIBN), A4 being less than A2;
- maintenance of the mixture at a temperature between 0° C. and 200° C., depending on the radical-generating systems used, and typically from 40° C. and 130° C., for a minimum time of one hour in the preferred case of the use of AIBN;
- addition of an optional amount A5 of radical generator which can be similar or not to that used in A4, such as azobisisobutyronitrile (AIBN), A5 preferably being equal to A4 but being able to be between 0 and 10 A4;
- optional maintenance, in the case where A5 is nonzero, of the mixture at a temperature of between 0° C. and 200° C., depending on the radical-generating systems used, and typically from 40° C. and 130° C., for a minimum time of one hour in the preferred case of the use of AIBN.

The invention also relates to a process for the synthesis of w-acrylate-terminated poly(3-hexylthiophene)-grafted copolymer, comprising the successive stages of:
- treatment of an amount A1 of co-hydroxyl-terminated P3HT in a container placed beforehand under an inert atmosphere, for example by a plurality of vacuum/molecular nitrogen cycles;
- addition of an amount A2 of polar solvent, preferably tetrahydrofuran, the A1/A2 ratio being between 2 and 10;
- addition of an amount A3 of a base, preferably a tertiary amine, preferentially triethylamine, A3 being less than A2;
- addition of an acid chloride, preferably a (meth)acryloyl chloride, preferably acryloyl chloride.

Advantageously, all the processes targeted above comprise a final stage of isolation of the product by techniques known to a person skilled in the art, such as, for example, by solvent evaporation or, preferably, by precipitation from cold methanol, followed by filtration/drying of the product.

DESCRIPTION OF THE APPENDED FIGURES

Figure 2:
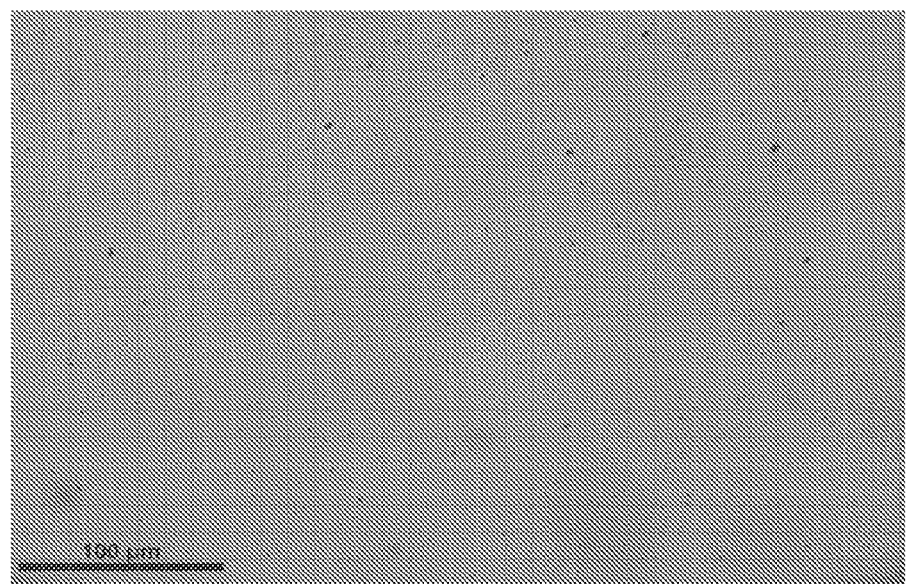

The description which will follow is given solely by way of illustration and without limitation with reference to the appended figures, in which:
FIG. 1 exhibits the general appearance of the grafted copolymer according to the invention;
FIG. 2 is a photograph of a dispersion of MWCNTs in water in the presence of PVA-g-P3HT.

DETAILED DESCRIPTION OF THE INVENTION

The composition according to the invention comprises, in its general definition, a grafted copolymer consisting:
- of a linear trunk 1 comprising at least one nonaromatic vinyl polymer or one unsaturated polyolefin, and
- at least two grafts 2 attached to said trunk via a chemical bond, each consisting of a conjugated polymer.

As regards a linear trunk 1 of the grafted copolymer, it is a polymer comprising, as monomer, an α-olefin.

The α-olefins having from 2 to 30 carbon atoms are preferred.

Mention may be made, as α-olefin, of ethylene, propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene, 1-eicosene, 1-docosene, 1-tetracosene, 1-hexacosene, 1-octacosene and 1-triacontene.

This polyolefin can be a homopolymer when just one α-olefin is polymerized in the polymer chain. Mention may be made, as examples, of polyethylene (PE) or polypropylene (PP). This polyolefin can also be obtained by hydrogenation of a polydiene, such as polyisoprene or polybutadiene.

This polyolefin can also be a copolymer when at least two comonomers are copolymerized in the polymer chain, one of the two comonomers, referred to as the "first comonomer", being an α-olefin and the other comonomer, referred to as the "second comonomer", being a monomer capable of polymerizing with the first monomer.

Mention may be made, as second comonomer, of:
- one of the α-olefins already mentioned, this being different from the first α-olefin comonomer,
- dienes, such as, for example, 1,4-hexadiene, ethylidenenorbornene, butadiene or isoprene,
- esters of unsaturated carboxylic acids, such as, for example, alkyl acrylates or alkyl methacrylates combined together under the term alkyl(meth)acrylates. The alkyl chains of these (meth)acrylates can have up to 30 carbon atoms. Mention may be made, as alkyl chains, of methyl, ethyl, propyl, n-butyl, sec-butyl, isobutyl, tert-butyl, pentyl, hexyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, eicosyl, henicosyl, docosyl, tricosyl, tetracosyl, pentacosyl, hexacosyl, heptacosyl, octacosyl or nonacosyl. Preference is given to methyl, ethyl and butyl(meth)acrylates as esters of unsaturated carboxylic acids.
- carboxylic acid vinyl esters. Mention may be made, as examples of carboxylic acid vinyl esters, of vinyl acetate, vinyl versatate, vinyl propionate, vinyl butyrate or vinyl maleate. Preference is given to vinyl acetate as carboxylic acid vinyl ester.

It would not be departing from the scope of the invention if different "second comonomers" were copolymerized in the polyolefin trunk.

Generally, the linear trunk 1 can consist of one molecule as described below:

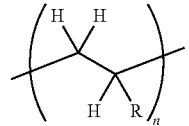

where R is not an aromatic molecule or a branching comprising an aromatic molecule and n is an integer greater than or equal to 2.

The production of the linear trunk 1 is fully known to a person skilled in the art.

In particular, ethylene/α-olefin copolymers are conventionally obtained by processes known to a person skilled in the art, such as, for example, by Ziegler-Natta, metallocene or organometallic polymerization.

Depending on the types and ratio of monomers, the polyolefin trunk can be semicrystalline or amorphous. In the case of amorphous polyolefins, only the glass transition temperature is observed whereas, in the case of semicrystalline polyolefins, a glass transition temperature and a melting point (necessarily the greater) are observed. It will be sufficient for a person skilled in the art to select the monomer ratios and the molecular weights of the polyolefin trunk in order to be able to easily obtain the desired values for glass transition temperature, optionally melting point and also viscosity of the polyolefin trunk.

As regards the grafts 2 intended to be grafted to the linear trunk 1, they are conjugated polymers. The expression "conjugated polymers" is understood to mean conjugated polymers having a characteristic electronic structure referred to as "band structure". These polymers are marked by the presence on the backbone of an alternation between double and single bonds.

As is known to a person skilled in the art, to dope a conjugated polymer generally consists in giving electrons to the latter (reducing) or in extracting electrons from the latter (oxidizing). This mechanism results in the modification of the structure of the molecule (the geometry) and thereby the modification of its electronic properties, namely its conductivity.

Mention may be made, as nonlimiting examples of conjugated polymers, of polyacetylene, polypyrrole, polythiophene, polyphenylene and polyaniline but, more generally, the conjugated polymers bring together three main families:

- poly(p-phenylene vinylene)s (PPVs), for example poly[2-methoxy-5-(2'-ethylhexyloxy)-1,4-phenylene vinylene] (MEH-PPV) or poly[2-methoxy-5-(3',7'-dimethyloctyloxy)-1,4-phenylene vinylene] (MDMO-PPV);
- polythiophenes (PTs) resulting from the polymerization of thiophenes and which are sulfur heterocycles, for example poly(3-hexylthiophene) (P3HT);
- polyfluorenes, for example poly[2,7-(9,9-dioctylfluorene)-alt-5,5-(48,78-di-2-thienyl-28,18,38-benzothiadiazole)] (PFDTBT).

Among all the conjugated polymers which can be chosen to participate in the composition according to the present invention, the applicant company has a preference for poly(3-hexylthiophene) (P3HT).

The grafts 2 are attached to the linear trunk 1 by conventional techniques known to a person skilled in the art. From this viewpoint, mention will be made of the technique of the addition to the linear trunk 1 by conventional chemical reaction between the ends of the grafts 2 and a reactive functional group on said linear trunk 1 but reference may also be made to the document WO 1995/029199.

Among all the grafted copolymers corresponding to the definition according to the present invention, the application company has identified three preferred components, namely:

- a polyisoprene grafted with poly(3-hexylthiophene);
- an acrylate (preferably polybutyl acrylate) grafted with poly(3-hexylthiophene);
- a poly(vinyl alcohol) grafted with poly(3-hexylthiophene).

In addition to the production techniques known to a person skilled in the art for obtaining these three grafted copolymers, the applicant company has developed novel processes capable of exhibiting a particular advantage, in particular from the viewpoint of the purity of the product obtained and of a reduced production cost.

Synthesis of Polyisoprene Grafted with P3HT:

First of all, it is appropriate to synthesize w-thiol-terminated poly(3-hexylthiophene):

140 mg (milligrams) of ω-allyl-terminated P3HT with a mass $M_n$=1700 g·mol$^{-1}$ (gram per mole) (0.08 mmol) have to be introduced into a two-necked round-bottomed flask equipped with a molecular nitrogen/vacuum outlet and surmounted by a burette of degassed/distilled toluene. Three vacuum/molecular nitrogen cycles subsequently have to be carried out and then 5 ml of toluene have to be added. The mixture has to be left to stir at 45° C. (Celsius) for 2 hours in order for complete dissolution to take place. The solution is then brought back to ambient temperature and then 1 g (gram) (0.9 ml) of 1,3-propanedithiol (0.92 mmol) is added. The mixture then has to be left to stir for 5 minutes. It is then necessary to introduce 3 mg of recrystallized azobisisobutyronitrile (AIBN) (0.02 mmol) and to place the reaction medium at 80° C. After reacting for 3 h 30, it is necessary to again add 3 mg of AIBN. The mixture then has to be left to stir at 80° C. for 16 hours. At the end of the reaction, precipitation is carried out from cold methanol (50 ml). The product is filtered off and dried under vacuum at ambient temperature for 24 hours.

The synthesis of the grafted copolymer PI-g-P3HT is carried out as follows:

120 mg of ω-thiol-terminated P3HT with a mass $M_n$=1700 g·mol$^{-1}$ (0.07 mmol) are introduced into a two-necked round-bottomed flask equipped with a molecular nitrogen/vacuum outlet and surmounted by a burette of degassed/distilled toluene. Three vacuum/molecular nitrogen cycles have to be carried out and then 8 ml of toluene have to be added. Subsequently, the mixture has to be left to stir at 60° C. for 1 hour in order for complete dissolution to take place. The mixture is brought back to ambient temperature and then 40 mg of poly(isoprene) with a mass $M_n$=2650 g·mol$^{-1}$ (0.015 mmol, 16% of 1.2 unit and 67% of 3.4 unit) are added. The mixture has to be left to stir for 1 hour, then 3 mg of recrystallized AIBN (0.02 mmol) subsequently have to be introduced and the reaction medium has to be placed at 80° C. After reacting for 3 h 30 (three hours and 30 minutes), 3 mg of AIBN are again added. The mixture then has to be left to stir at 80° C. for 16 hours. At the end of the reaction, precipitation is carried out from cold methanol (80 ml). Finally, the product has to be filtered off and dried under vacuum at ambient temperature for 24 hours.

Synthesis of an Acrylate Grafted with P3HT:

The synthesis of ω-acrylate-terminated poly(3-hexylthiophene) is carried out as follows:

280 mg of ω-hydroxyl-terminated P3HT with a mass $M_n$=2000 g·mol$^{-1}$ (0.14 mmol) have to be introduced under a stream of molecular nitrogen into a two-necked round-bottomed flask, dried beforehand with a paint burner under vacuum, with a molecular nitrogen/vacuum outlet and surmounted by a burette of freshly distilled tetrahydrofuran (THF). It is subsequently necessary to carry out three vacuum/molecular nitrogen cycles, then to leave the round-bottomed flask under vacuum and to add 50 ml of THF. Finally, the mixture has to be left to stir at 40° C. for at least 30 min in order for complete dissolution of the polymer to take place. Subsequent to this stage, the mixture has to be brought back to ambient temperature and then 2.2 ml of triethylamine (15.5 mmol) have to be added under a stream of molecular nitrogen using a purged syringe. Subsequently, it is necessary to leave stirring for 15 minutes in order to then cool the reaction medium to 0° C. Finally, the acryloyl chloride then has to be added dropwise via a purged syringe. It is then necessary to leave stirring for 24 hours while allowing the reaction medium to return to ambient temperature. At the end of the reaction, the polymer is precipitated from cold methanol (500 ml). At the end, as final stage, it is necessary to filter and then dry the product under vacuum at ambient temperature for 48 hours.

Subsequently, the synthesis of the grafted copolymer PBA-g-P3HT is carried out as follows:

100 mg of ω-acrylate-terminated P3HT with a mass $M_n$=2000 g·mol$^{-1}$ (0.05 mmol) and also 4 mg of alkoxyamine derivative (0.01 mmol) (Blocbuilder® from Arkema) are introduced into a Schlenk tube equipped with a molecular nitrogen/vacuum outlet. It is subsequently necessary to carry out three vacuum/molecular nitrogen cycles in order to remove any traces of molecular oxygen, in order to subsequently introduce 0.5 ml of degassed toluene. Subsequently, the mixture has to be left to stir at 45° C. for 30 minutes in order for complete dissolution to take place. Subsequently, it is necessary to return to ambient temperature and to then add 0.05 ml of n-butyl acrylate (0.35 mmol), distilled and degassed beforehand. The mixture has to be left to stir at ambient temperature for five minutes. The polymerization is initiated by directly immersing the Schlenk tube in an oil bath at 115° C. It is desirable to leave stirring for five hours, to then again introduce 0.05 ml of n-butyl acrylate in order to again add the same amount at the end of sixteen hours. It is necessary to leave stirring for twenty four hours. At the end of the reaction, the operator immerses the Schlenk tube in liquid nitrogen in order to halt the polymerization and the product is precipitated from cold methanol (5 ml), filtered and dried under vacuum at 50° C. for twenty four hours. The remaining macromonomers are separated by flash chromatography (silica gel, dichloromethane). The copolymer is subsequently recovered by virtue of a dichloromethane/ethyl acetate (85/15) mixture. The product has to be precipitated from cold methanol, filtered and dried under vacuum at 50° C. for 24 hours.

Synthesis of a Poly(Vinyl Alcohol) Grafted with P3HT:

The synthesis of ω-carboxylic acid-terminated poly(3-hexylthiophene) is carried out as follows:

140 mg of ω-allyl-terminated P3HT with a mass $M_n$=1700 g·mol$^{-1}$ (0.08 mmol) have to be introduced into a two-necked round-bottomed flask equipped with a molecular nitrogen/vacuum outlet and surmounted by a burette of degassed/distilled toluene. It is subsequently necessary to carry out three vacuum/molecular nitrogen cycles and to then add, under a stream of molecular nitrogen, 5 ml of toluene. The mixture has to be left to stir at 45° C. for two hours in order for complete dissolution to take place. It is necessary to return to ambient temperature and to then add 1 g (0.8 ml) of mercaptopropionic acid (0.94 mmol). Preferably, it is subsequently desirable to leave stirring for five minutes. It is necessary to subsequently introduce 3 mg of recrystallized AIBN (0.02 mmol) and to place the reaction medium at 80° C. After reacting for 3 h 30, it is necessary to again add 3 mg of AIBN. It is desirable to then leave stirring at 80° C. for 16 hours. At the end of the reaction, the mixture is precipitated from cold methanol (50 ml). Finally, the product is filtered off and dried under vacuum at ambient temperature for 24 h.

The synthesis of the grafted copolymer PVA-g-P3HT is carried out as follows:

100 mg of commercial poly(vinyl acetate) (PVA) with an average mass $M_n$=18 000 g·mol$^{-1}$ (0.01 mmol) are introduced into a single-necked round-bottomed flask equipped with a molecular nitrogen/vacuum outlet and dried with a paint burner under vacuum, and three vacuum/molecular nitrogen cycles are carried out. It is subsequently necessary to add 9 ml of distilled dimethyl sulfoxide under a stream of molecular nitrogen using a purged syringe and to heat at 60° C. in order for complete dissolution of the polymer to take place. It is subsequently desirable to leave stirring at 60° C. for 2 hours and to then return to ambient temperature. 90 mg of ω-carboxylic acid-terminated P3HT with a mass $M_n$=1700 g·mol$^{-1}$ (0.05 mmol) are introduced into a Schlenk tube equipped with a molecular nitrogen/vacuum outlet and dried with a paint burner under vacuum. Three vacuum/molecular nitrogen cycles are carried out and then 3 ml of distilled dichloromethane are added. The mixture is then left stirring at ambient temperature for two hours. Subsequently, this second solution subsequently has to be added dropwise to the first using a purged syringe and the reaction mixture is left stirring at 40° C. for 30 min. It is then necessary to introduce 8 mg of 4-(dimethyl-amino)pyridinium 4-toluenesulfonate (0.03 mmol) and to leave stirring for 30 min, still at 40° C. Finally, it is necessary to add 85 mg of N,N'-diisopropylcarbodiimide (0.07 mmol) and to leave stirring at 40° C. for 72 hours. At the end of the reaction, it is necessary to precipitate the copolymer PVA-g-P3HT from dichloromethane (100 ml), to filter and to dry under vacuum at 60° C. for 24 h.

Finally, it should be noted that the composition according to the invention advantageously incorporates, in particular in the application of organic photovoltaic cells, small molecules which are characterized by their low molecular weight which does not exceed a few thousand units of atomic mass. After the fashion of the conjugated polymers, these small molecules are electron acceptors or donors, which makes it possible for the latter to also facilitate the transportation of electric charges and to be capable of forming excitons with the conjugated polymers.

These small molecules are generally added to the composition by dissolution in the mixture comprising the other components (polymers).

Mention will be made, as such, of:

$C_{60}$ fullerene, which is a compound formed of 60 carbon atoms and which has a spherical shape close to that of a soccer ball. This molecule is preferred here as additive in the composition according to the invention even though it was specified above that the term fullerene denotes a molecule composed exclusively of carbons which can take a geometrical shape recalling that of a sphere, an ellipsoid, a tube (known as nanotube) or a ring;

methyl [6,6]-phenyl-$C_{61}$-butanoate (PCBM), which is a fullerene derivative having a chemical structure which has been modified in order to render it soluble;

carbon nanotubes and graphenes;

perylene, consisting of an aromatic nucleus of hydrocarbons of chemical formula $C_{20}H_{12}$, for example N,N'-dimethyl-3,4,9,10-perylenetetracarboxylic diimide (PTCDI) (perylene derivative with two nitrogen atoms, two oxygen atoms and two methyl groups $CH_3$), or perylene-3,4,9,10-tetracarboxylic dianhydride (PTCDA) (perylene derivative with six oxygen atoms).

In the specific application of the composition in photovoltaic modules, as UV radiation is capable of resulting in a slight yellowing of the composition used, UV stabilizers and UV absorbers, such as benzotriazole, benzophenone and the other hindered amines, can be added in order to ensure the transparency of the encapsulant during its lifetime. These compounds can, for example, be based on benzophenone or on benzotriazole. They can be added in amounts of less than 10% by weight and preferably from 0.1% to 5% by weight of the total weight of the composition.

It will also be possible to add antioxidants in order to limit the yellowing during the manufacture of the encapsulant, such as phosphorus-comprising compounds (phosphonites and/or phosphites) and hindered phenolic compounds. These antioxidants can be added in amounts of less than 10% by weight and preferably from 0.1% to 5% by weight of the total weight of the composition.

Flame-retarding agents can also be added. These agents may or may not be halogenated. Mention may be made, among halogenated agents, of brominated products. Use may also be made, as non-halogenated agent, of phosphorus-based additives, such as polyphosphate, phosphinate or pyrophosphate, ammonium phosphate, melamine cyanurate, pentaerythritol, zeolites and the mixtures of these agents. The composition can comprise these agents in proportions ranging from 3% to 40%, with respect to the total weight of the composition.

If this is desired in a specific application, it is also possible to add pigments, such as, for example, coloring or brightening compounds, in proportions generally ranging from 5% to 15% with respect to the total weight of the composition.

As regards the other aspects of the invention relating to the use of the composition according to the invention in a photovoltaic module, a person skilled in the art may refer, for example, to the Handbook of Photovoltaic Science and Engineering, Wiley, 2003, volume 7.

It should again be noted that the composition according to the present invention can also be used in other fields than that of photovoltaics. In particular, the composition according to the invention can be used in transparent electrodes for photovoltaic cells or organic light-emitting diodes (OLEDs).

A person skilled in the art can also envisage using the composition according to the invention in semiconducting inks for electronic printing devices.

It should be noted that the composition according to the invention can be used for the dispersion of carbon nanotubes, it being possible for this dispersion to be used in the manufacture of electrodes or other components participating in the manufacture of optoelectronic devices, such as photovoltaic cells or OLEDs.

Materials Employed to Form the Test Formulations:

In the following, tests on compositions according to the invention are presented which demonstrate that these compositions are satisfactory from the viewpoint of the first two technical problems set out above, namely, essentially:

1. the problem of compatibilization of a mixture between an electron-donating material and an electron-accepting material in an organic cell, 2. to enhance the surfactant qualities in order to improve the quality and the stability of inks.

It should be noted that, regarding the metal/organic material interface physicochemical problem, it has been found, by the applicant company, through a great number of experiments, that the compositions according to the invention make it possible to improve and to stabilize organic/inorganic interfaces in an organic device with at least one metal electrode. Results will be able to be presented subsequently by the applicant company.

Copolymers of polyolefin grafted with P3HT (PI-g-P3HT), polyacrylate grafted with P3HT (PBuA-g-P3HT) and poly(vinyl alcohol) (PVA-g-P3HT) type were tested as compatibilizer of an active layer of an organic photovoltaic cell composed of a mixture of a conjugated polymer, P3HT, and of a fullerene, PCBM.

1) Use of Grafted Copolymers as Compatibilizer of the Active Layer (Abovementioned Problem 1):

Production of the Test Formulations and Films:

In this case, the test cells were prepared under a controlled atmosphere (absence of oxygen and of moisture, as measured at contents <10 ppm) starting from a formulation comprising one of the grafted copolymers, P3HT and PCBM. The formulation is produced in the following way:

Different amounts of compatibilizer (0% to 10% by weight, with respect to the P3HT/PCBM amount) are introduced into a solution of P3HT/PCBM (1/1 mixture, overall concentration of 40 mg·ml$^{-1}$) in ortho-dichlorobenzene. The solutions thus prepared are then left stirring at 50° C. (degrees Celsius) for 16 hours in order to have complete dissolution. Furthermore, the ITO (indium oxide In$_2$O$_3$ doped with tin) on glass substrates are washed in an ultrasonic bath. This is carried out, in a first step, in acetone, then in ethanol and finally in isopropanol. Each washing operation lasts fifteen minutes. After having dried and treated the substrate with UV/ozone for fifteen minutes, a thin layer of PEDOT-PSS (poly(3,4-ethylenedioxythiophene)=PEDOT and poly(sodium styrenesulfonate)=PSS) was deposited by the spin coating technique well known to a person skilled in the art at a speed of five thousand revolutions per minute (5000 rev/min) and subsequently dried in an oven at 110° C. under dynamic vacuum. The thickness of the PEDOT-PSS layer is 50 nm (nanometers). It was measured using an Alpha-step IQ Surafe Profiler device. Subsequently, the active layer, P3HT/PCBM mixture with different amounts of compatibilizer (filtered using a PTFE membrane, with pores with a diameter of 0.2 μm), was deposited by spin coating above the PEDOT-PSS layer under an inert atmosphere. The thickness of the active layer is between 80 and 100 nm. The cathode (aluminum) was deposited thermally through a shadow mask with a pressure of 10$^{-7}$ mbar (millibar). The active surface area of the device is 8.4 mm$^2$ (millimeters squared). A standard configuration was employed for the manufacture of the device: glass/ITO/PEDOT-PSS/active layer/aluminum. After having deposited the cathode, a thermal annealing is carried out on a heating plate at 165° C. for twenty minutes. The devices are subsequently cooled to ambient temperature before any characterization. All the procedures carried out after the deposition of the PEDOT-PSS layer were carried out in a glove box under an inert atmosphere (molecular nitrogen) with an amount of dust and molecular oxygen of less than 0.1 ppm (part per million).

Tests Carried Out on the Films:

The current/voltage measurements on the device were carried out with a Keithley 4200 SCS device in the dark and under illumination of 100 mW·cm$^{-2}$ (milliwatts per centimeter squared) using a K.H.S. SOlarCellTest575 simulator device with AM1.5G filters. The contacts were made using a probe of Karl Suss PM5 type. There are four diodes per sample. In order to confirm the repeatability of the performances, the measurements were carried out on 8 different solar diodes.

The photovoltaic effect of a solar cell is characterized by the following parameters: the open-circuit voltage ($V_{oc}$), the short-circuit current ($J_{SC}$) and the fill factor (FF). The power conversion efficiency (PCE) is the ratio of the power generated to the power of the incident light ($P_{in}$):

$$PCE=(V_{oc}*J_{SC}*FF)/P_{in}$$

Results of the Tests Carried Out:

The PCE was measured several times for each composition, before the annealing at 165° C. and after the annealing. Depending on the series, the PCE obtained after annealing for the reference cell (without addition of copolymer) is approximately 4.5%, which thus corresponds to the tests according to the prior art.

The relative effect of the addition of the copolymer on the PCE (as percentage of improvement), before and after annealing, with compositions according to the invention is shown in the following table. The results presented with the compositions according to the invention show a significant enhancement in the performances, which are considered with respect to the reference cell of the prior art.

| Additive | Modification to the PCE before annealing | Modification to the PCE after annealing |
| --- | --- | --- |
| PI-g-P3HT | From +30% to +60% | From +10% to +40% |
| PBuA-g-P3HT | From +20% to +50% | From +5% to +20% |
| PVA-g-P3HT | From +0% to +5% | From −5% to +0% |

The improvement after annealing shows a true effect of the additives on the morphology and the performances. The even greater improvement before annealing shows a positive effect on the processability of the active layer (faster production of the optimum morphology) and thus the possibility of reducing the annealing times and/or temperatures and thus the production cost.

2) Improvement in the Quality of the Inks—Their Stabilities—Based on Dispersion of Carbon Nanotubes (Abovementioned Problem 2):

Production of the Test Formulations and Films:

The inks (dispersions) studied were prepared from multi-walled carbon nanotubes (MWCNTs, Arkema®) dispersed in water without any addition of ionic surfactant.

The reference formulation comprises 0.1% (by weight with respect to the total) of MWCNTs. The total volume of water used is 5 ml for each of the formulations.

0.5% (by weight with respect to the total) of an additive was added to this reference formulation (=state of the art): this additive is either a grafted copolymer of PVA-g-P3HT type or a poly(vinyl alcohol) (PVA) of equivalent molar mass (=state of the art).

Tests Carried Out on the Films:

All the formulations were subjected to a sonicator for twenty minutes.

The dispersions are first observed with the naked eye, then with an optical microscope on a glass slide and, finally, with an atomic force microscope (AFM) after on-glass deposition and drying.

Results of the Tests Carried Out:

| Reference formulation (state of the art) | Formulation with PVA (state of the art) | Formulation with PVA-g-P3HT (composition according to the invention) |
|---|---|---|
| Separation by settling (2 phases) | Separation by settling (2 phases) | Dispersion of the nanotubes in the water |

In the case of the formulation according to the invention, the dispersions are very fine; the size of the biggest particles observed in microscopy is of the order of a micron. Homogeneous films were prepared from these dispersions, which results are confirmed in AFM (Atomic Force Microscopy) visible in FIG. 2.

After aging for seven days, the dispersions did not change and are still as stable.

These results show that, by virtue of the invention, it is possible to obtain stable MWNTC inks which can be used to easily form layers of this material (in particular electrodes) during the process for the preparation of the photovoltaic cell and also in other types of devices (for example OLEDs).

The invention claimed is:

1. A composition comprising a grafted copolymer, the grafted copolymer consisting essentially of:
    a linear trunk comprising at least one nonaromatic vinyl polymer or one unsaturated polyolefin, and
    at least two grafts, attached to said trunk via a chemical bond, wherein one of the grafts consists essentially of a first conjugated polymer and one of the grafts consists essentially of a second conjugated polymer; and
    wherein said composition additionally comprises:
    1—fullerenes and a third conjugated polymer, or
    2—at least one of carbon nanotubes and graphene.

2. The composition as claimed in claim 1, wherein the at least two grafts have the same molar mass.

3. The composition as claimed in claim 1, wherein the first and second conjugated polymers consist essentially of poly(3-hexylthiophene).

4. The composition as claimed in claim 1, wherein the grafted copolymer and the third conjugated polymer are of the same nature.

5. The composition as claimed in claim 1, wherein the linear trunk consists essentially of a polydiene.

6. The composition as claimed in claim 1, wherein the linear trunk consists essentially of an acrylic polymer or polyacrylate.

7. The composition as claimed in claim 6, wherein the linear trunk consists essentially of a polyalkyl acrylate.

8. The composition as claimed in claim 1, wherein the linear trunk has hydroxyl functional groups so as to confer amphiphilic properties on the trunk.

9. The composition as claimed in claim 1, wherein the linear trunk consists essentially of poly(vinyl alcohol).

10. The composition as claimed in claim 1, wherein the first and second conjugated polymers are selected from the group consisting of poly(phenylene vinylene)s, polythiophenes and polyfluorenes.

11. An organic photovoltaic cell of a photovoltaic module comprising the composition as claimed in claim 1, when the composition comprises fullerenes and a conjugated polymer.

12. A photovoltaic module exhibiting at least one layer forming an encapsulant comprising a photovoltaic cell and a layer forming a back sheet, said photovoltaic cell comprising a composition as claimed in claim 1.

13. An electrode comprising the composition as claimed in claim 1, when the composition comprises carbon nanotubes and/or graphene.

14. A process for the synthesis of the conjugated polymer of the composition as claimed in claim 1 in which the conjugated polymer is ω-thiol-terminated, the process comprising the successive stages of:
    treatment of an amount, A1, of ω-allyl-terminated P3HT in a container placed beforehand under an inert atmosphere;
    addition of an amount, A2, of nonpolar aromatic solvent, the A1/A2 ratio being between 15 and 50;
    addition of an amount, A3, of an alkanedithiol, A3 being less than A2;
    addition of an amount, A4, of a radical generator of the peroxide or diazo type, A4 being less than A2;
    maintenance of the mixture at a temperature between 0° C. and 200° C., depending on the radical-generating systems used;
    addition of an optional amount, A5, of radical generator which can be similar or not to the radical generator of amount A4, A5 being between 0 and 10 A4;
    optional maintenance, in the case where A5 is nonzero, of the mixture at a temperature of between 0° C. and 200° C., depending on the radical-generating systems used.

15. The process as claimed in claim 14, wherein the process comprises a final stage of isolation of the product, followed by filtration/drying of the product.

16. A process for the synthesis of the grafted polymer of the composition as claimed in claim 1 in which the grafted copolymer is polyolefin-g-P3HT, the process comprising the successive stages of:
    treatment of an amount, A1, of ω-thiol-terminated P3HT in a container placed under an inert atmosphere;
    addition of an amount, A2, of nonpolar aromatic solvent, the A1/A2 ratio being between 5 and 30;
    maintenance of the mixture at more than 25° C. for at least 30 minutes;
    addition of an amount, A3, of unsaturated polyolefin, A3 being between A1 and A2;
    addition of an amount, A4, of a radical generator of the peroxide or diazo type A4 being less than A2;
    maintenance of the mixture at a temperature between 0° C. and 200° C., depending on the radical-generating systems used;
    addition of an optional amount, A5, of radical generator which can be similar or not to the radical generator of amount A4, A5 being between 0 and 10 A4;
    optional maintenance, in the case where A5 is nonzero, of the mixture at a temperature of between 0° C. and 200° C., depending on the radical-generating systems used.

17. A process for the synthesis of the grafted polymer of the composition as claimed in claim 1 in which the grafted polymer is ω-acrylate-terminated poly(3-hexylthiophene), the process comprising the successive stages of:
- treatment of an amount, A1, of ω-hydroxyl-terminated P3HT in a container placed beforehand under an inert atmosphere;
- addition of an amount, A2, of polar solvent, the A1/A2 ratio being between 2 and 10;
- addition of an amount, A3, of a base, A3 being less than A2;
- addition of an acrylate chloride.

* * * * *